United States Patent
Phan

(10) Patent No.: US 8,804,456 B1
(45) Date of Patent: Aug. 12, 2014

(54) DELAY LOCKED LOOP (DLL) SYSTEM FOR A MEMORY DEVICE WITH WIDE OPERATING FREQUENCY VIA A VARIABLE SUPPLY APPLIED TO A DELAY LINE

(71) Applicant: Nanya Technology Corp., Tao-Yuan Hsien (TW)

(72) Inventor: John T. Phan, Sugar Land, TX (US)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 0 days.

(21) Appl. No.: 13/853,032

(22) Filed: Mar. 28, 2013

(51) Int. Cl.
*G11C 8/18* (2006.01)
*H03L 7/06* (2006.01)

(52) U.S. Cl.
USPC .............. 365/233.12; 365/233.13; 365/233.1; 365/194; 365/227; 327/277; 327/143; 327/155; 327/158

(58) Field of Classification Search
USPC ............ 365/194, 191, 233.12, 233.13, 233.1, 365/227, 228, 226; 327/276, 277, 143, 141, 327/155, 158
See application file for complete search history.

(56) References Cited

U.S. PATENT DOCUMENTS

| | | | | |
|---|---|---|---|---|
| 5,818,209 | A * | 10/1998 | Masini et al. | 323/289 |
| 6,469,557 | B2 * | 10/2002 | Hirabayashi | 327/263 |
| 8,278,989 | B2 * | 10/2012 | Noda | 327/270 |
| 2010/0138684 | A1 * | 6/2010 | Kim et al. | 713/601 |

* cited by examiner

*Primary Examiner* — Andrew Q Tran
(74) *Attorney, Agent, or Firm* — Winston Hsu; Scott Margo

(57) ABSTRACT

A DLL system in a memory device with wide frequency application includes: a clock receiver that generates a clock for the DLL system; a delay line, coupled to the clock receiver, for receiving the generated clock and delaying the clock according to a received power supply; a power regulator, for generating the power supply to the DLL delay line according to a bias; a control logic, coupled to the clock receiver, for generating a plurality of logic signals respectively corresponding to a plurality of frequency ranges of the clock; and a bias generator, coupled between the control logic and the power regulator, for providing the bias to the power regulator, wherein the value of the bias is according to a logic signal output by the control logic.

14 Claims, 3 Drawing Sheets

DELAY LOCKED LOOP (DLL) SYSTEM FOR A MEMORY DEVICE WITH WIDE OPERATING FREQUENCY VIA A VARIABLE SUPPLY APPLIED TO A DELAY LINE

BACKGROUND OF THE INVENTION

1. Field of the Invention

This invention relates to DLLs, and more particularly, to DLLs in memories that have a wide frequency application.

2. Description of the Prior Art

Many memory devices incorporate Delay Locked Loops (DLLs) which contain an internal delay loop/delay line that locks to an external clock rate. The DLLs are used to eliminate clock insertion delay. A typical example of a memory type that uses a DLL is Double Data Rate (DDR) memories, which are next generation memory devices that transfer data on both rising and falling edges of a clock signal.

Please refer to FIG. 1. FIG. 1 is a diagram of a conventional DLL system 100 in a memory. As shown in the diagram, the DLL system 100 includes a DLL delay line 150 that has a fixed power supply supplied by a bias generator 120 coupled to a power regulator 130. The DLL delay line 150 is further coupled to an RCV buffer 110 that is the clock receiver for the DLL system 100, and receives a differential clock signal VCLK and \VCLK. The amount of delay will be according to the operating frequency of the DLL system 100; at higher operating frequencies, only a few delay elements in the delay line will be used, so there is less delay between the external and internal clock. At lower frequencies, the entire delay line 150 will be used. The operating frequency range of a memory that uses a DLL is therefore limited by the number of delay elements within the DLL.

Most memory systems have an operating range according to the JEDEC spec, which is a specification used in the field that provides standardized operating parameters for memories. For example, a DDR3 memory device has a recommended clock frequency range of 800 MHz 1600 MHz. Although it is possible for memories to operate outside this frequency range (when power saving is required, for example), this would necessitate increasing the typical number of delay elements within the delay line 150. The subsequent increase in space required for the DLL delay line 150 means this solution is usually not implemented by manufacturers. A second option is to bypass the DLL system 100 entirely when operating at lower frequencies. In conventional memories, the DLL system 100 would need to be disabled. In doing so, data output timing will no longer be the same as when the DLL system 100 is enabled and there is a risk that the accuracy of the memory will be adversely affected to an undesirable degree.

With this in mind, there is a need for a DLL system to be used in a memory that can operate outside the standard operating frequency range of the memory without increasing the number of delay elements within the DLL system or disabling the DLL system during low (or high) frequency operation.

SUMMARY OF THE INVENTION

It is therefore an objective of the present invention to provide a DLL system for a memory that has a modulated power supply which changes on the fly based on the memory operating frequency. This extended frequency range means the DLL system can function accurately at frequencies outside its prescribed range.

A DLL system in a memory device with wide frequency application comprises: a clock receiver that generates a clock for the DLL system; a delay line, coupled to the clock receiver, for receiving the generated clock and delaying the clock according to the clock frequency and a received power supply; a power regulator, for generating the power supply to the DLL delay line according to a bias; a control logic, coupled to the clock receiver, for generating a plurality of logic signals respectively corresponding to a plurality of frequency ranges of the clock; and a bias generator, coupled between the control logic and the power regulator, for providing the bias to the power regulator, wherein the value of the bias is according to a logic signal output by the control logic.

A method for dynamically changing the power supply of a DLL delay line of a DLL system in a memory device with wide frequency application comprises: generating a clock for the DLL system; determining an operating frequency of the clock and comparing the determined frequency against a plurality of frequency ranges; generating a specific logic signal that corresponds to a specific frequency range; and utilizing the specific logic signal to set the power supply for the DLL delay line.

These and other objectives of the present invention will no doubt become obvious to those of ordinary skill in the art after reading the following detailed description of the preferred embodiment that is illustrated in the various figures and drawings.

DETAILED DESCRIPTION

The present invention provides a DLL system operating in a memory device that has a wide frequency application, wherein a delay line power supply of the DLL system can be modulated on the fly according to an operating frequency of the memory device.

As detailed in the description of the related art, a conventional DLL delay line operates at a fixed power supply. When a memory is operated at a frequency outside of the frequency range determined by the JEDEC spec, the fixed power supply for the DLL delay line coupled with the limited number of delay elements in the DLL delay line will be insufficient to lock the internal delay loop to the external clock at this clock frequency. This means the memory cannot use the DLL system at this clock frequency (a frequency which is outside the supporting clock frequency range of the DLL system).

The present invention therefore provides a DLL system in a memory device that comprises a frequency detection mechanism, and uses this detected frequency to modulate the power supply to the delay line of the DLL system.

As is well-known, a delay line of a DLL is made up of many delay elements, where each delay element contributes a successive delay. The final delayed clock signal is according to a total delay of these delay elements. When the power supply to the delay line is increased, the total delay will be decreased (and vice versa). This means that the wide frequency application is more limited at the upper range than at the lower. In the following, the invention will be described with reference to lowering the operating frequency; however, the same technique can be utilized when the operating frequency is increased.

Figure 1:
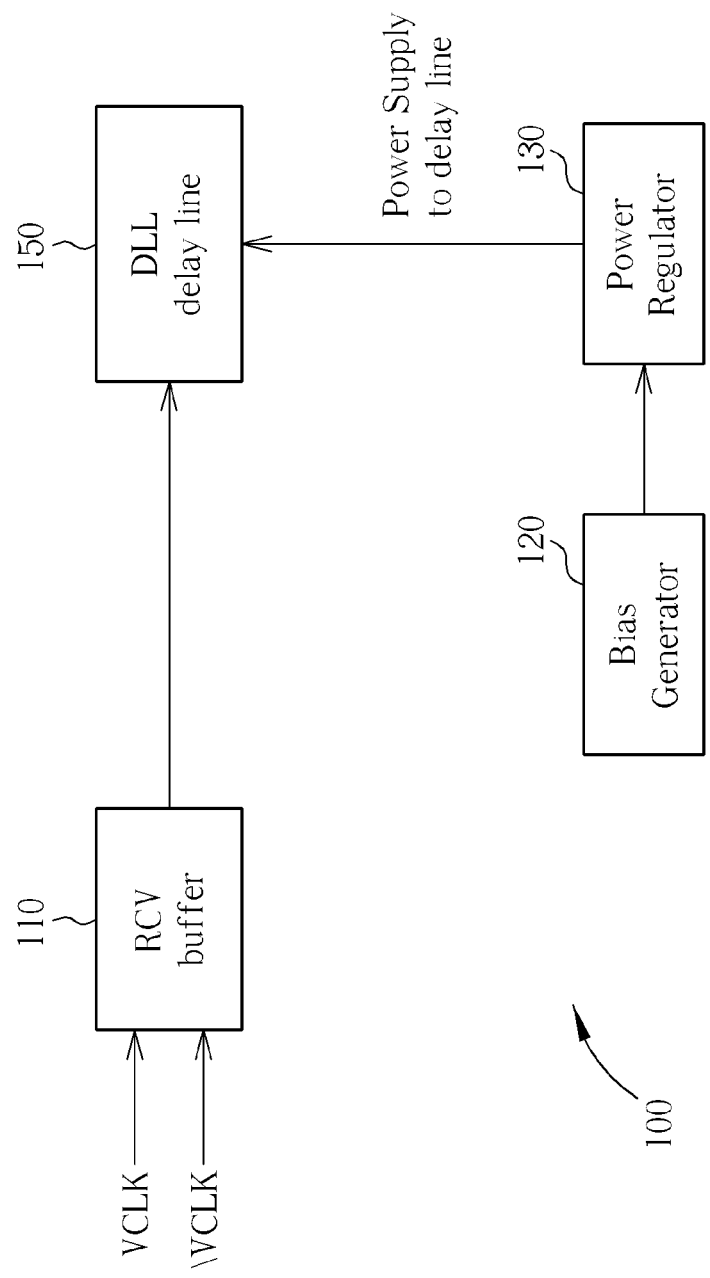
FIG. 1 is a diagram of a DLL system in a memory device according to the conventional art.
Figure 2:
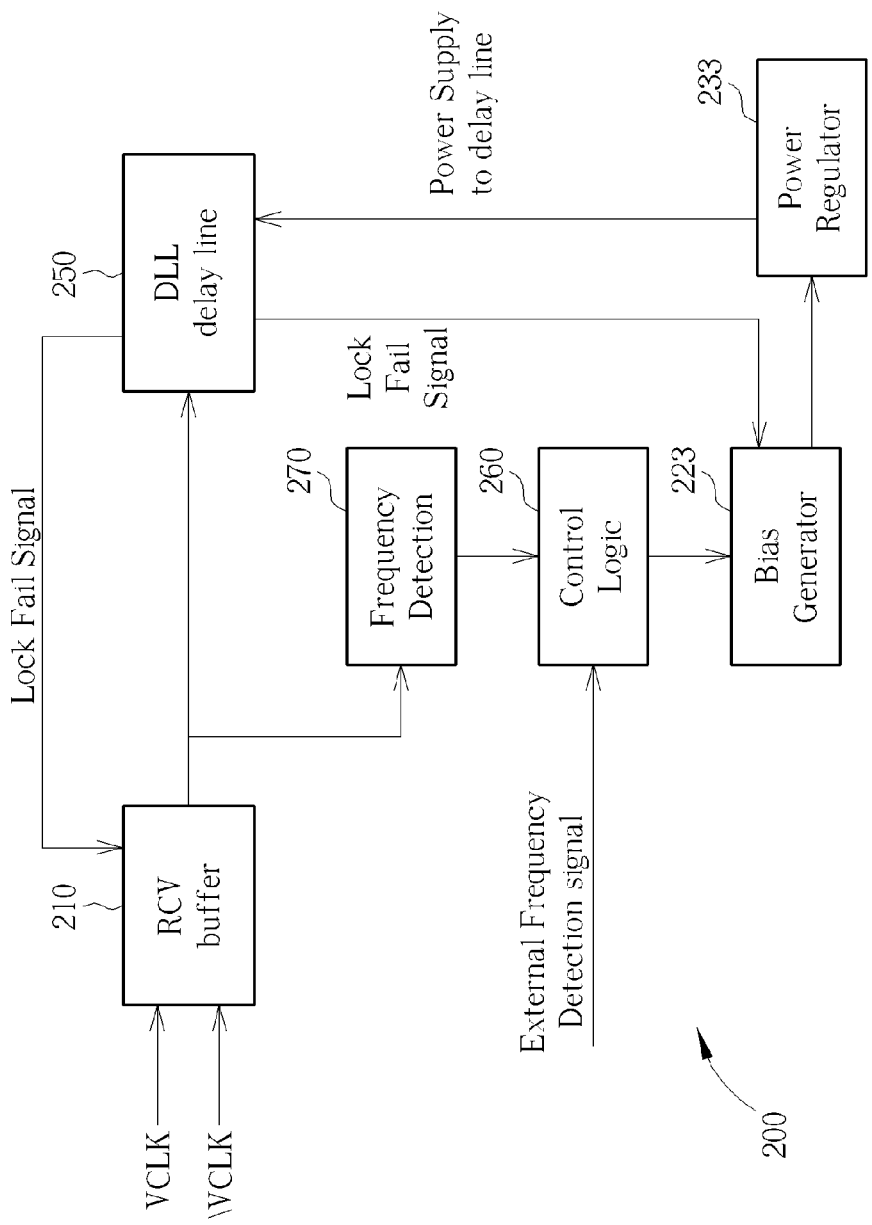
FIG. 2 is a diagram of a DLL system in a memory device according to an exemplary embodiment of the present invention.

Please refer to FIG. 2, which is a diagram of a DLL system 200 in a memory device according to an exemplary embodiment of the present invention. As shown in the diagram, the DLL system 200 comprises a DLL delay line 250, an RCV buffer 210, a bias generator 223 and a power regulator 233. The RCV buffer 210 (or clock receiver) receives a differential clock signal VCLK and \VCLK. The DLL system 200 also comprises a frequency detection unit 270 coupled to a control logic 260, which supplies an input to the bias generator 223.

The frequency detection unit 270 is further coupled to the RCV buffer 210 for determining the operating frequency of the DLL system 200. The frequency detection unit 270 in turn supplies this detected frequency to the logic unit (control logic) 260. The control logic 260 will generate output logic signals according to the detected frequency and a predetermined operating frequency range, which corresponds to the JEDEC specification for a standard memory device. In other words, depending on which memory system (DDR2, DDR3, FLASH etc.) the control logic 260 is used in, a different operating frequency range will be defined.

In this description, the operating range of the DLL system 200 is taken as 800 MHz~1600 MHz, which is the standard operating frequency range of a DDR3 memory. The frequency detection unit 270 constantly outputs detected frequencies to the control logic 260. When the control logic 260 detects an operating frequency above 1600 MHz it will output a first logic signal; when it detects an operating frequency below 800 MHz it will output a second logic signal; and when it detects an operating frequency between 800 MHz and 1600 MHz it will output a third logic signal. Please note, however, that this is merely one example, and the control logic 260 can output a different number of logic signals according to system requirements. In another embodiment, the system could be used to switch between DDR2 and DDR3 memory devices, such that the system could operate within the JEDEC spec defined operating frequencies of both memory types as well as outside their prescribed frequency ranges. In this case, at least four thresholds comprising upper and lower operating frequencies for both memories would need to be defined, meaning the control logic 260 would need to output more logic signals than in the above example. Such a modification could easily be realized by one skilled in the art after reading the specification and the accompanying drawings.

When the control logic 260 outputs the third logic signal to the bias generator 223, this indicates that the DLL system 200 is operating within the prescribed frequency range of the memory device; therefore, the bias generator will control the power regulator 233 to provide the DLL delay line 250 with the standard power supply. When the control logic 260 outputs the second logic signal to the bias generator 223, this indicates that the DLL system 200 is being operated below the prescribed frequency range, and therefore the power supply to the DLL delay line 250 must be lowered. The bias generator 223 and power regulator 233 therefore work to reduce the power supply to the delay line of the DLL delay line 250. Similarly, when the first logic signal is output, the bias generator 223 and power regulator 233 will work to increase the power supply to the DLL delay line 250. As the frequency detection unit 270 and control logic 260 are constantly detecting the operating frequency and outputting corresponding logic signals, the power supply to the DLL delay line 250 can be constantly modulated.

It is not essential to the present invention to utilize the frequency detection unit 270 for determining the operating frequency. In some embodiments, frequency detection could be performed by an external input that informs the control logic 260 of the current operating frequency, as shown in FIG. 2. Other devices or signals within the DLL system 200 that detect an operating frequency and couple to the control logic 260 can also be used.

In a further embodiment, a feedback loop from the DLL delay line 250 can also be incorporated to improve the operation of the DLL system 200. If there is a mismatch between the operating frequency and the power supply to the DLL delay line 250, the DLL delay line 250 will fail to lock. In this situation, a 'fail' signal can be fed back to the bias generator 223 or RCV buffer 210 for respectively altering the voltage or the operating frequency.

Figure 3:
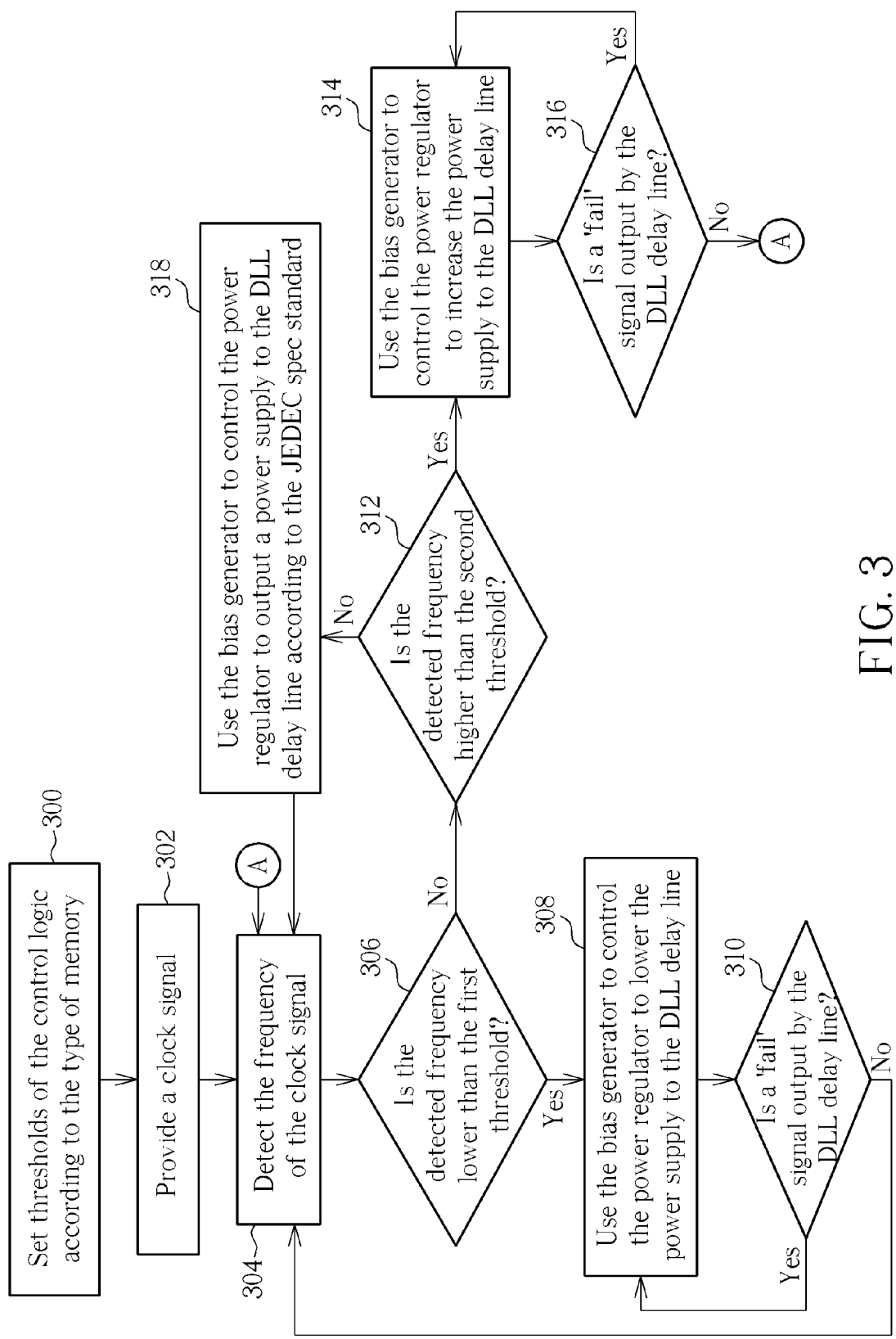
FIG. 3 is a flowchart illustrating a method of dynamically altering the power supply of a DLL delay line of a DLL system according to an exemplary embodiment of the present invention.

To more clearly illustrate the method of the present invention, a flowchart is provided in FIG. 3. Please note that this flowchart is according to the exemplary embodiment detailed above, wherein the control logic 260 can output three logic signals. Those skilled in the art, however, will be able to modify this method according to system requirements after reading the specification. The steps of the flowchart are detailed as follows:

Step 300: Set thresholds of the control logic according to the type of memory;
Step 302: Provide a clock signal;
Step 304: Detect the frequency of the clock signal;
Step 306: Is the detected frequency lower than the first threshold? If yes, go to Step 308; if no, go to Step 312;
Step 308: Use the bias generator to control the power regulator to lower the power supply to the DLL delay line;
Step 310: Is a 'fail' signal output by the DLL delay line? If yes, return to Step 308; if no, return to Step 304;
Step 312: Is the detected frequency higher than the second threshold? If yes, go to Step 314; if no, go to Step 318;
Step 314: Use the bias generator to control the power regulator to increase the power supply to the DLL delay line;
Step 316: Is a 'fail' signal output by the DLL delay line? If yes, return to Step 314; if no, return to Step 304;
Step 318: Use the bias generator to control the power regulator to output a power supply to the DLL delay line according to the JEDEC spec standard; return to Step 304.

In summary, the present invention provides a method and system for extending an operating frequency range of a DLL system in a memory such that it can achieve high accuracy at frequencies outside its usual operating range. This is achieved by a system that can modulate the power supply to a delay line on-the-fly when it is determined that the memory is operating at a frequency outside the normal operating range.

Those skilled in the art will readily observe that numerous modifications and alterations of the device and method may be made while retaining the teachings of the invention.

What is claimed is:

1. A delay locked loop (DLL) system in a memory device with wide frequency application, comprising:
   a clock receiver that generates a clock for the DLL system;
   a delay line, coupled to the clock receiver, for receiving the generated clock and delaying the clock according to a received power supply;
   a power regulator, for generating a power supply to the delay line according to a bias;
   a control logic, coupled to the clock receiver, for generating a plurality of logic signals respectively corresponding to a plurality of frequency ranges of the clock; and
   a bias generator, coupled between the control logic and the power regulator, for providing the bias to the power regulator, wherein the value of the bias is according to a logic signal output by the control logic.

2. The DLL system of claim 1, further comprising:
a frequency detection unit, coupled between the clock receiver and the control logic, for detecting an operating frequency of the clock and supplying the result to the control logic.

3. The DLL system of claim 1, wherein the control logic determines an operating frequency of the clock according to a detection signal from an external input.

4. The DLL system of claim 1, wherein the plurality of frequency ranges of the clock are predetermined, and are according to the JEDEC specification (JEDEC spec) of the memory device.

5. The DLL system of claim 4, wherein the plurality of frequency ranges are defined according to a first frequency threshold and a second frequency threshold, the first frequency threshold represents a lowest frequency of an operating range for the memory device according to the JEDEC spec, and the second frequency threshold represents a highest frequency of the operating range for the memory device according to the JEDEC spec.

6. The DLL system of claim 5, wherein when an operating frequency of the clock is between the first frequency threshold and the second frequency threshold, the control logic will output a logic signal that controls the bias generator and the power regulator to generate the power supply to the delay line according to the JEDEC spec; when the operating frequency of the clock is below the first frequency threshold, the control logic will output a logic signal that controls the bias generator and the power regulator to lower the power supply; and when the operating frequency of the clock is above the second frequency threshold, the control logic will output a logic signal that controls the bias generator and the power regulator to increase the power supply.

7. The DLL system of claim 1, wherein after the power supply to the delay line is generated, the delay line will output a feedback signal to the DLL system indicating whether or not the delay line has locked to the clock, and if the feedback signal indicates the delay line has not locked to the clock, the DLL system will change the power supply.

8. The DLL system of claim 1, wherein after the power supply to the delay line is generated, the delay line will output a feedback signal to the DLL system indicating whether or not the delay line has locked to the clock, and if the feedback signal indicates the delay line has not locked to the clock, the DLL system will change the operating frequency of the clock.

9. A method for dynamically changing a power supply of a delay line in a DLL system in a memory device with wide frequency application, comprising:

generating a clock for the DLL system;
determining an operating frequency of the clock and comparing the determined operating frequency against a plurality of frequency ranges;
generating a specific logic signal that corresponds to a specific frequency range; and
utilizing the specific logic signal to set the power supply for the delay line of the DLL system.

10. The method of claim 9, wherein the plurality of frequency ranges are predetermined, and are according to the JEDEC spec of the memory device.

11. The method of claim 10, wherein the plurality of frequency ranges are defined according to a first frequency threshold and a second frequency threshold, the first frequency threshold represents a lowest frequency of an operating range for the memory device according to the JEDEC spec, and the second frequency threshold represents a highest frequency of the operating range for the memory device according to the JEDEC spec.

12. The method of claim 11, wherein when the operating frequency of the clock is between the first frequency threshold and the second frequency threshold, the step of utilizing the specific logic signal to set the power supply for the delay line comprises:
generating the power supply to the delay line according to the JEDEC spec;
when the operating frequency of the clock is below the first frequency threshold, the step of utilizing the specific logic signal to set the power supply for the delay line comprises:
lowering the power supply;
and when the operating frequency of the clock is above the second frequency threshold, the step of utilizing the specific logic signal to set the power supply for the delay line comprises:
increasing the power supply.

13. The method of claim 9, further comprising:
outputting a feedback signal to the DLL system indicating whether or not the delay line has locked to the clock; and
when the feedback signal indicates the delay line has not locked to the clock, changing the power supply.

14. The method of claim 9, further comprising:
outputting a feedback signal to the DLL system indicating whether or not the delay line has locked to the clock; and
when the feedback signal indicates the delay line has not locked to the clock, changing the operating frequency of the clock.

* * * * *

UNITED STATES PATENT AND TRADEMARK OFFICE
CERTIFICATE OF CORRECTION

| | | |
|---|---|---|
| PATENT NO. | : 8,804,456 B1 | Page 1 of 1 |
| APPLICATION NO. | : 13/853032 | |
| DATED | : August 12, 2014 | |
| INVENTOR(S) | : John T. Phan | |

It is certified that error appears in the above-identified patent and that said Letters Patent is hereby corrected as shown below:

On the title page, item (54), and in the specification, column 1, line 1, correct the title of invention from "DELAY LOCKED LOOP (DLL) SYSTEM FOR A MEMORY DEVICE WITH WIDE OPERATING FREQUENCY VIA A VARIABLE SUPPLY APPLIED TO A DELAY LINE" to --DELAY LOCKED LOOP (DLL) SYSTEM FOR A MEMORY DEVICE WITH WIDE OPERATING FREQUENCY VIA A VARIABLE POWER SUPPLY APPLIED TO A DELAY LINE--.

Signed and Sealed this
Eleventh Day of November, 2014

Michelle K. Lee
*Deputy Director of the United States Patent and Trademark Office*